United States Patent [19]
Wang et al.

[11] Patent Number: 5,731,719
[45] Date of Patent: Mar. 24, 1998

[54] PHASE DETECTOR FOR A TERNARY SIGNAL

[75] Inventors: Yun-Che Wang, Los Altos; Thomas Korn; Chuan-Ding Arthur Hsu, both of San Jose, all of Calif.

[73] Assignee: Cypress Semiconductor Corporation, San Jose, Calif.

[21] Appl. No.: 554,512

[22] Filed: Nov. 7, 1995

[51] Int. Cl.$^6$ ........................................... H03K 5/22
[52] U.S. Cl. ........................... 327/76; 327/74; 327/62; 326/59; 326/60
[58] Field of Search .................. 327/58, 62, 74–81, 327/85, 88–90; 326/59, 60; 341/57

[56] References Cited

U.S. PATENT DOCUMENTS

| | | |
|---|---|---|
| 4,302,690 | 11/1981 | Gollnger et al. ........................ 326/60 |
| 4,449,065 | 5/1984 | Davies, Jr. ............................. 326/60 |
| 4,682,052 | 7/1987 | Kyomasu ............................... 326/57 |
| 5,045,728 | 9/1991 | Crafts ..................................... 326/60 |

FOREIGN PATENT DOCUMENTS

| | | | |
|---|---|---|---|
| 60-75119 | 4/1985 | Japan ........................................ 327/76 |
| 2031694 | 4/1980 | United Kingdom ....................... 326/60 |

OTHER PUBLICATIONS

IBM Technical Disclosure Bulletin (Gruodis, A.J.), vol. 4, No. 1, Jun. 1961.

*Primary Examiner*—Timothy P. Callahan
*Assistant Examiner*—Kenneth B. Wells
*Attorney, Agent, or Firm*—Bliss McGlynn, P.C.

[57] ABSTRACT

A method and apparatus for recovering timing information from a ternary signal includes transforming a ternary signal into a binary signal while retaining the necessary timing information. A two facet circuit initially receives a ternary signal, one that includes three levels of values. A first facet of this circuit transforms the ternary signal into two binary signals, each having one of the three levels represented by one value and both having the same level represented by the other value. The second facet of this circuit combines the two binary signals to produce a third binary signal that has one value representing one level and another value representing the two other levels.

20 Claims, 2 Drawing Sheets

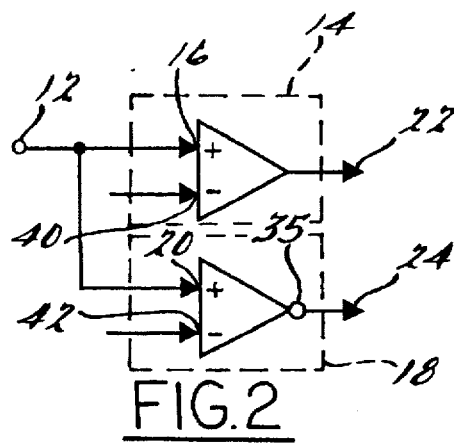
FIG.2
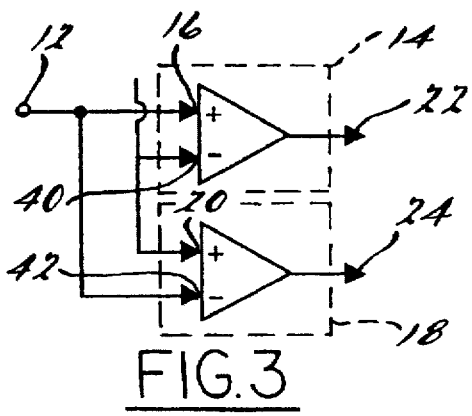
FIG.3
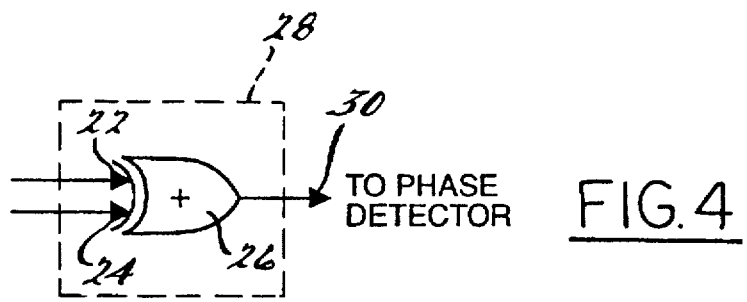
FIG.4
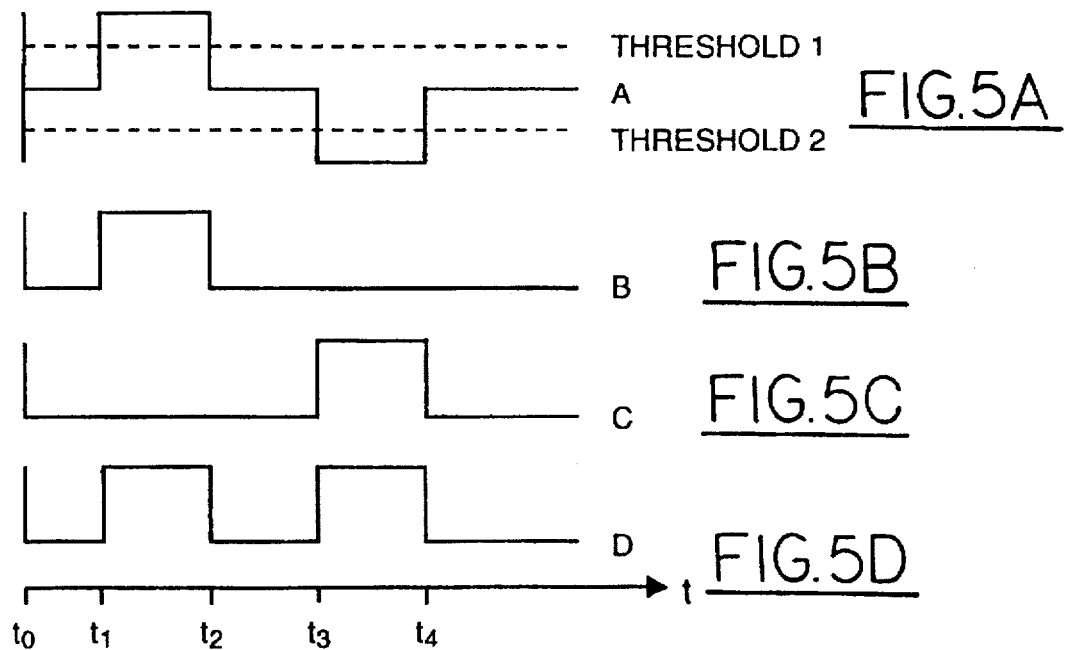

PHASE DETECTOR FOR A TERNARY SIGNAL

BACKGROUND OF THE INVENTION

1. Field of the Invention

The present invention pertains to circuits for recovering timing information from a ternary signal and more particularly to a method and apparatus for transforming a ternary signal into a binary signal while retaining the necessary timing information.

2. Related Prior Art

Phase locked loop is a common method to recover timing reference for data transmission systems. A phase locked loop typically consists of voltage controlled oscillator, phase detector, charge pump and filter. The general principle of phase locked loop operation is a correction mechanism where phase error information is generated by the phase detector when comparing two signals, the input of the system and the output of the voltage controlled oscillator. The phase locked loop also includes a means of converting this phase error into a voltage or current control signal. This control signal is used in the feedback path of the phase locked loop.

Known implementations of phase locked loop use analog and/or digital circuit techniques. The timing information (clock pulses) as output by the phase locked loop is a digital, binary signal (high/low or 0/1 or on/off) in general. One could implement three level logic to perform the phase detector function or possibly construct a means to compare phases between a binary signal and a ternary signal.

FIG. 1A is a block diagram of a phase locked loop system having circuits for receiving a ternary signal input and converting it to a binary output for use in a phase locked loop system. A ternary input, having three distinct levels, is received at node 12. This input is bifurcated and is received by detector 14 at input 16 and by detector 18 at input 20. Detector 14 provides an input 22 to phase detector 23 and detector 18 provides an input 24 to phase detector 25. Phase detector 23 and phase detector 25 provide inputs to filter circuit 26, which provides an output to voltage controlled oscillator 27.

In operation, detector 14 receives a ternary input and converts this input to a binary output, which becomes the input to phase detector 23. Detector circuit 14 detects one level of the three level signal it receives as input and provides this signal as input to phase detector 23.

Detector 18 similarly receives a ternary input and converts this input to a binary output. Detector circuit 18 also detects one level of the three level signal it receives as input and provides this signal as input to phase detector 25. Phase detectors 23 and 25 process these inputs and provide the input to filter 26. Filter 26 provides the control signal to control the output of voltage controlled oscillator 27. The output from voltage controlled oscillator 27 is one of the inputs to phase detectors 23 and 25 that comprise the phase locked loop.

In this circuit, two phase detectors are required for use in a phase locked loop system receiving a ternary signal. This is common when a ternary signal is used as the input for the phase locked loop system.

SUMMARY OF THE INVENTION

The present invention provides a method and apparatus for retrieving timing information from a ternary signal. The present invention includes a concept that may be thought of in two parts. The first part is a conversion process that converts a ternary signal into two binary signals via pre-established signal thresholds. The second part of the present invention consists of combining the two binary digital signals into a single binary signal without loss of information content and uses it as the input to the Phase Detector.

The implementations of the present invention may consist of very simple electronic circuits. The first part of the present invention, the ternary to dual binary conversion, can be implemented with two voltage comparators or their equivalent. There are many ways to use the two voltage comparators of the present invention. The combination of the two binary signals from the two comparators can also be implemented in a plurality of ways with varying degrees of complexity. The preferred simple and effective method for accomplishing the combination is the use of an exclusive OR (XOR) gate.

BRIEF DESCRIPTION OF THE DRAWINGS

FIG. 2 is a circuit diagram of a first embodiment of a portion of the block diagram of FIG. 1B.

FIG. 3 is a circuit diagram of a second embodiment of a portion of the block diagram of FIG. 1B.

FIG. 4 is a circuit diagram of an embodiment of a second portion of the block diagram of FIG. 1B.

FIG. 5A is a graphical representation of a typical ternary signal having a high slew rate received as input.

FIGS. 5B and 5C are a graphical representations of the outputs of the circuits of FIG. 2 with the signal of FIG. 5A as input.

FIG. 5D is a graphical representation of the output of the circuit of FIG. 4 with the signals of FIGS. 5B and 5C as inputs.

FIG. 6A is a graphical representation of a typical ternary signal having a limited slew rate received as input.

FIGS. 6B and 6C are a graphical representations of the outputs of the circuits of FIG. 2 in response to an input of the signal in FIG. 6A.

FIG. 6D is a graphical representation of the output of the circuit of FIG. 4 in response to receiving the signals of FIGS. 6B and 6C as inputs.

DESCRIPTION OF THE PREFERRED EMBODIMENT

The present invention deals with the need to recover timing information from a three level, ternary, input signal and its impact on the Phase detector. As stated previously, the present invention may be thought of in two parts, a first part that converts a ternary signal into two binary signals via pre-established signal thresholds and a second part that consists of combining the two binary digital signals into a single binary signal.

Figure 1A:
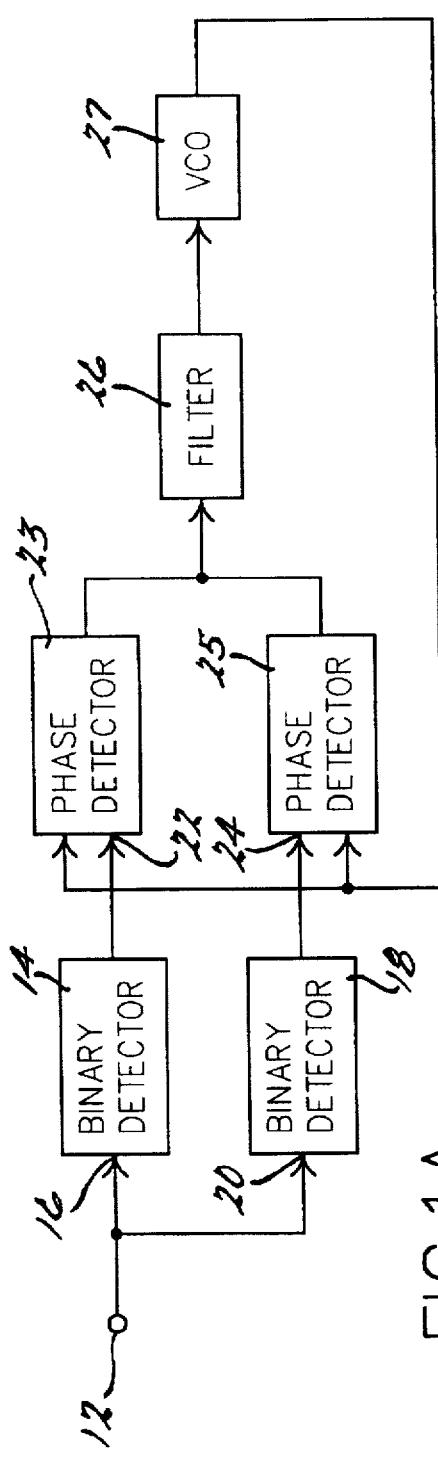
FIG. 1A is a block representation of a system for placing timing information from a ternary signal into a binary signal in a phase locked loop circuit.
Figure 1B:
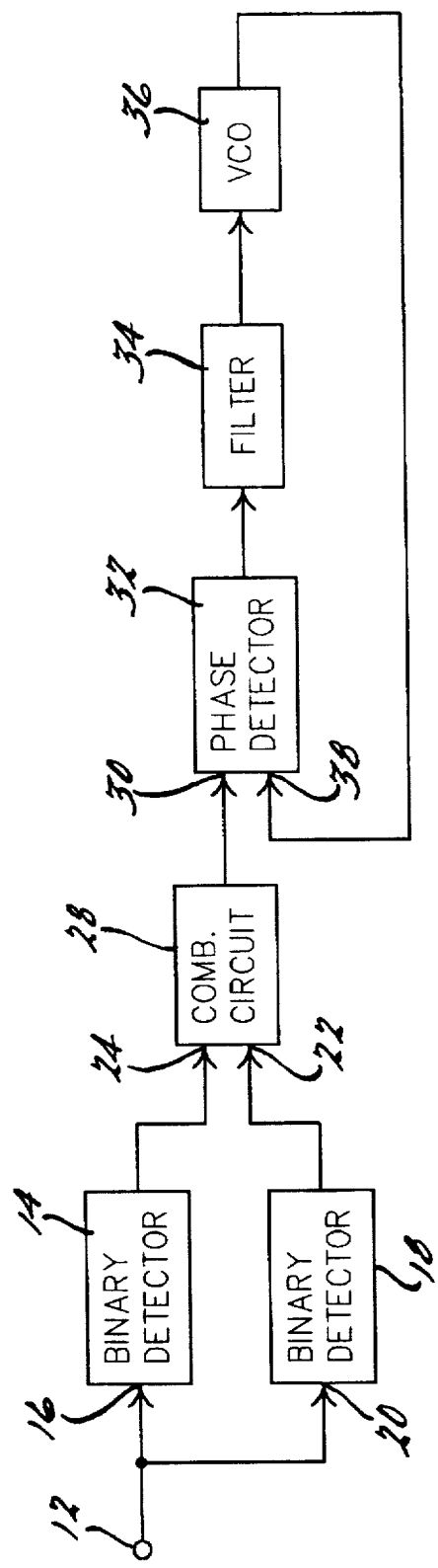
FIG. 1B is a block representation of a system for placing timing information from a ternary signal into a binary signal in a phase locked loop circuit using a single phase detector.

Referring now to FIG. 1B, a block diagram of a circuit for receiving a ternary signal input and converting it to a binary output is illustrated. A ternary input, having three distinct levels, is received at node 12. This input is bifurcated and is received by detector 14 at input 16 and by detector 18 at input 20. Detector 14 provides an input 22 and detector 18 provides an input 24 to a combination circuit 28, which provides an output 30 to phase detector 32. Phase detector 32 provides the input for filter circuit 34 which provides the control signal for voltage controlled oscillator 36. Oscillator 36 provides a second input 38 to phase detector 32.

In operation, detector 14 receives a ternary input and converts this input to a binary output, which becomes the input to combination circuit 28. Detector circuit 14 detects one level of the three level signal it receives as input. The one level it detects may be output as either a high or a low, however, in the preferred embodiment it is output as a high signal. Also, in the preferred embodiment, the level that is detected by detector circuit 14 is the highest value of the ternary signal.

Detector 18 similarly receives a ternary input and converts this input to a binary output, which becomes another input to combination circuit 28. Detector circuit 18 also detects one level of the three level signal it receives as input. In the preferred embodiment, the level that is detected by detector circuit 18 is the lowest value of the ternary signal. The one level it detects is also output as a high signal in the preferred embodiment. The input to combination circuit 28 at 22 is a binary signal having a high wherever the ternary signal received at node 12 was at its lowest level and low at all other points of the ternary signal. The input to combination circuit 28 at 24 is high wherever the ternary signal received at node 12 was at its highest level and low at all other points. Combination circuit 28 combines these signals such that output 30 is a binary signal that is high whenever ternary signal at node 12 is either at its highest level or at its lowest level and low whenever ternary signal at node 12 is at its intermediate or middle level. The correction mechanism of the phase locked loop is phase detector 32 where phase error information is generated when comparing two signals, the input of the system, which has been converted to a single binary signal and the output of the voltage controlled oscillator 36. The phase error signal is fed to filter 34 which is a means of converting this phase error into a voltage or current control signal and provided to voltage controlled oscillator 36 to control its output. The output of voltage controlled oscillator 36 is used in the feedback path of the phase locked loop system and input to phase detector 32.

Referring now to FIG. 2, one possible embodiment of detector circuits 14 and 18 is illustrated. Detector circuits 14 and 18 are illustrated as voltage comparators, having inputs receiving threshold voltages at inputs 40 and 42 respectively. In this embodiment, as an example, the highest level of the ternary signal is assumed positive, the lowest level is assumed negative and the middle level is assumed to be zero.

In this embodiment, the threshold voltage input at 40 is a positive threshold. Anytime the ternary signal is more positive than the threshold, the output at 22 is high. Anytime the threshold is more positive than the ternary signal, the output at 22 is low. Similarly, in this embodiment, the threshold voltage input at 42 is a negative threshold. Anytime the ternary signal is more positive than the threshold, the output from detector 18 is high. Anytime the threshold is more positive than the ternary signal, the output from detector 18 is low. Detector 18 has an invertor 35 connected to its output so that the binary signal at 24 is high when the threshold signal is more positive than the ternary signal. Thus, the binary signals at 22 and 24 are high whenever ternary signal is at its highest level and at its lowest level, respectively, and both binary signals are low whenever the ternary signal at node 12 is at its middle level.

FIG. 3 illustrates an alternate embodiment of voltage comparators 14 and 18. In this arrangement, the ternary signal at node 12 is input at 16 for detector circuit 14 and at 32 for detector circuit 18. In this embodiment, the same threshold voltage is input at 40 for detector circuit 14 and at 20 for detector circuit 18. The threshold voltage is preferably a value between the value of the highest level and the value of the lowest level of the ternary signal at node 12. For ternary signals with a high slew rate, any value between the highest level and the lowest level is sufficient (see FIG. 5A). For ternary signals with limited slew rates (see FIG. 6A), a value equal to the middle level of the ternary signal is preferred, however, any value may be used, depending on the desired results.

FIG. 4 illustrates an exclusive OR gate as the preferred embodiment of combination circuit 28. Whenever combination circuit 28 receives a high input at either 22 or 24, it produces a high output at 30. If no high input is received, the output at 30 remains low, or in the preferred embodiment, zero.

FIGS. 5A through 5D illustrate the inputs and outputs of the various circuits illustrated in FIGS. 2–4. FIG. 5A illustrates a ternary signal having a high slew rate, while FIGS. 5B and 5C illustrate the signals at 22 and 24 respectively. FIG. 5D illustrates the output from combination circuit 28 at 30.

At time $t_0$, ternary signal A is at a middle level and signals B, C and D of FIGS. 5B, 5C and 5D, respectively, are low, or in this illustration, zero. At time $t_1$, ternary signal A rises to its highest level. Curve B, the signal at 22, also rises to a high, as ternary signal A becomes more positive than threshold 1. Curve C remains low even though ternary signal A is more positive than threshold 2 because invertor 44 inverts the output at 24. At time $t_2$, signal A becomes less positive than threshold 1 and curve B drops to a low or zero. Curve A is still more positive than threshold 2 so curve C remains low. Combination circuit 28 no longer has a high input at either 22 or 24 so curve D drops to a low. At time $t_3$, ternary signal drops below threshold 2. Curve B remains low since threshold 1 is still more positive than curve A. Curve C goes high, again because of invertor 44. Even though threshold 2 is more positive than Curve A and a low is output from detector circuit 18, invertor 44 changes the low to a high. Curve C also goes high since combination circuit 28 now receives a high input at 24. At time $t_4$, when curve A returns to its middle level, curve B remains at low since threshold 1 is more positive than curve A, curve C returns to low since Curve A is more positive than threshold 2 and curve D returns to low since combination circuit is not receiving a high input at either 22 or 24.

A similar analysis holds true for a ternary signal with a limited slew rate, such as that illustrated in FIGS. 6A through 6D. The main distinguishing factor is that the transition from high to low at 22 and 24 can be controlled by setting the threshold values. For example, Curve B, and concomitantly, curve D, can be set to go high at any time between $t_B$ and $t_E$ by selecting the value for threshold 1. In this embodiment, the transition was chosen to occur at time $t_1$ and time $t_2$ respectively. By selecting the value of threshold 2, the time at which curve C, and concomitantly, curve D, goes high can also be selected. For this embodiment times $t_3$ and $t_4$ were selected as transition times.

The present invention has disclosed a method and apparatus for recovering timing information from a ternary signal. The present invention includes transforming a ternary signal into a binary signal while retaining the necessary timing information. Initially a ternary signal, one that includes three value levels, is received. The ternary signal is transformed into two binary signals, each having one of the three levels represented by one value and both having the same level represented by the other value. The two binary signals are combined to produce a third binary signal that has one value representing one level and an other value representing the two other levels.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. A circuit comprising:

receiving means for receiving a ternary signal having a first level, a second level, and a third level, said first level having a first pulse width, said second level having a second pulse width and said third level having a third pulse width;

first detecting means connected to said receiving means for (i) detecting said first level of said ternary signal and (ii) producing a first binary signal;

second detecting means connected to said receiving means for (i) detecting said third level of said ternary signal and (ii) producing a second binary signal; and combining means connected to said first detecting means and said second detecting means for combining said first binary signal and said second binary signal to produce a third binary signal having:

(a) a first logic level having said second pulse width when neither of said first level or said third level is detected, (b) a second logic level having said first pulse width when said first level is detected and said third pulse width when said third level is detected.

2. The circuit according to claim 1 wherein said first detecting means includes means for receiving a first reference signal, wherein said first binary signal has a first logic level having said first pulse width whenever said first level is detected and a second logic level whenever said first level is not detected.

3. The circuit according to claim 2 wherein said first detecting means includes a voltage comparator.

4. The circuit according to claim 2 wherein said second detecting means includes means for receiving a second reference signal, wherein said second binary signal has a first logic level having said third pulse width whenever said third level is detected and a second logic level whenever said third level is not detected.

5. The circuit according to claim 4 wherein said second detecting means includes means for inverting said first and second logic levels of said second binary signal.

6. The circuit according to claim 4 wherein said second detecting means includes a voltage comparator having an output and a means for converting said voltage comparator output.

7. The circuit according to claim 1 wherein said combining means includes an exclusive OR gate.

8. A method for obtaining timing information from a ternary signal comprising the steps of:

receiving a ternary signal having a first level, a second level, and a third level, said first level having a first pulse width, said second level having a second pulse width and said third level having a third pulse width;

detecting said first level of said ternary signal to produce a first binary signal;

detecting said third level of said ternary signal to produce a second binary signal;

combining said first binary signal and said second binary signal to produce a third binary signal having a first binary logic level having said second pulse width when neither of said first level or said third level is detected and a second binary logic level when said first level is detected and said third pulse width when said third level is detected.

9. The method according to claim 8 wherein said step of detecting said first level of said ternary signal includes comparing a first reference signal to said ternary signal, wherein said first binary signal has a first logic level having said first pulse width whenever said first level is detected and a second logic level whenever said first level is not detected.

10. The method according to claim 9 wherein said step of detecting said third level of said ternary signal includes comparing a second reference signal to said ternary signal, wherein said second binary signal has a first logic level having paid third pulse width whenever said third level is not detected and a second logic level whenever said third level is detected.

11. The method according to claim 10 wherein said step of detecting said third level of said ternary signal includes the step of inverting said first and second logic levels.

12. A circuit comprising:

an input configured to receive a ternary signal having a first level, a second level, a third level, said first level having a first pulse width, said second level having a second pulse width and said third level having a third pulse width;

a first detector circuit configured to: (i) receive said ternary signal and a first reference signal and (ii) produce a first binary signal having a first logic level whenever said first level of said ternary signal is detected, said first logic level of said first binary signal having said first pulse width and a second logic level whenever said first level of said ternary signal is not detected;

a second detector circuit configured to: (i) receive said ternary signal and a second reference signal, and (ii) produce a second binary signal having a first logic level whenever said third level of said ternary signal is detected, said first logic level of said binary signal having said third pulse width and a second logic level whenever said third level of said ternary signal is not detected; and a combining circuit connected to (i) said first detector circuit and (ii) said second detector circuit, said combining circuit configured to produce a third binary signal having:

(a) a first logic level having said second pulse width when neither of said first level or said third level is detected; and (b) a second logic level having said first pulse width when said first level is detected and said third pulse width when said third level is detected.

13. The circuit according to claim 12 wherein each of said first and second detector circuits includes a voltage comparator.

14. The circuit according to claim 13 wherein said voltage comparator includes a reference signal input.

15. A phase locked loop comprising:

receiving means for receiving a ternary signal having a first level, a second level, and a third level, said first level having a first pulse width, said second level having a second pulse width and said third level having a third pulse width:

first detecting means connected to said receiving means for (i) detecting said first level of said ternary signal and (ii) producing a first binary signal;

second detecting means connected to said receiving means for (i) detecting said third level of said ternary signal and (ii) producing a second binary signal;

combining means connected to said first detecting means and said second detecting means for combining said first binary signal and said second binary signal to produce a third binary signal having:
  (a) a first logic level having said second pulse width when neither of said first level or said third level is detected,
  (b) a second logic level having said first pulse width when said first level is detected and said third pulse width when said third level is detected;

a phase detector coupled to said combining means; and a voltage controlled oscillator coupled to said phase detector means.

16. The phased locked loop according to claim 15 comprising at most one phase detector.

17. The phased locked loop according to claim 15 further comprising a filter coupled to said phase detector and said voltage controlled oscillator.

18. A phase locked loop comprising:

an input configured to receive a ternary signal having a first level, a second level, a third level, said first level having a first pulse width, said second level having a second pulse width and said third level having a third pulse width;

a first detector circuit configured to: (i) receive said ternary signal and a first reference signal and (ii) produce a first binary signal having a first logic level whenever said first said first binary signal having said first pulse width and a second logic level whenever said first level of said ternary signal is not detected;

a second detector circuit configured to: (i) receive said ternary signal and a second reference signal, and (ii) produce a second binary signal having a first logic level whenever said third level of said ternary signal is detected, said first logic level of said binary signal having said third pulse width and a second logic level whenever said third level of said ternary signal is not detected;

a combining circuit connected to (i) said first detector circuit and (ii) said second detector circuit, said combining circuit configured to produce a third binary signal having:
  (a) a first logic level having said second pulse width when neither of said first level or said third level is detected; and
  (b) a second logic level having said first pulse width when said first level is detected and said third pulse width when said third level is detected;

a phase detector coupled to said combining circuit; and a voltage controlled oscillator coupled to said phase detector.

19. The phased locked loop according to claim 18 comprising at most one phase detector.

20. The phased locked loop according to claim 18 further comprising a filter coupled to said phase detector and said voltage controlled oscillator.

* * * * *